United States Patent
Mercier Des Rochettes et al.

(10) Patent No.: US 7,726,603 B2
(45) Date of Patent: Jun. 1, 2010

(54) SANDWICH-STRUCTURE FLAT ACTUATOR AND APPLICATION TO STRUCTURAL TORSION

(75) Inventors: Hugues Mercier Des Rochettes, Bondues (FR); Léon Buchaniek, Quesnoy sur Deûle (FR); Didier Joly, Sainghin en Weppes (FR)

(73) Assignee: ONERA (Office National d'Etudes et de Recherches Aerospatiales), Chatillon (FR)

( * ) Notice: Subject to any disclaimer, the term of this patent is extended or adjusted under 35 U.S.C. 154(b) by 512 days.

(21) Appl. No.: 11/600,223

(22) Filed: Nov. 16, 2006

(65) Prior Publication Data
US 2007/0205332 A1 Sep. 6, 2007

(30) Foreign Application Priority Data
Nov. 22, 2005 (FR) .................................. 05 11787

(51) Int. Cl.
B64C 3/52 (2006.01)
(52) U.S. Cl. .................... 244/99.8; 244/87; 310/333
(58) Field of Classification Search ............... 244/78.1, 244/87, 99.8, 200; 310/328, 333
See application file for complete search history.

(56) References Cited

U.S. PATENT DOCUMENTS

| | | | | | |
|---|---|---|---|---|---|
| 3,219,850 | A | * | 11/1965 | Langevin .................... | 310/333 |
| 4,539,501 | A | * | 9/1985 | Trong et al. ............. | 310/313 A |
| 4,564,825 | A | * | 1/1986 | Takahashi et al. ........... | 333/191 |
| 4,868,447 | A | * | 9/1989 | Lee et al. .................... | 310/328 |
| 4,963,781 | A | * | 10/1990 | Sumihara et al. ............ | 310/328 |
| 5,288,039 | A | * | 2/1994 | DeLaurier et al. .......... | 244/219 |
| 5,374,011 | A | * | 12/1994 | Lazarus et al. ............. | 244/99.8 |
| 5,440,193 | A | * | 8/1995 | Barrett ........................ | 310/328 |
| 5,473,214 | A | * | 12/1995 | Hildebrand ................. | 310/321 |
| 5,529,458 | A | * | 6/1996 | Humpherson ............. | 416/20 R |
| 5,781,646 | A | * | 7/1998 | Face ........................... | 381/190 |
| 5,869,189 | A | * | 2/1999 | Hagood et al. ............. | 428/461 |

(Continued)

FOREIGN PATENT DOCUMENTS

EP 0822602 2/1998

(Continued)

OTHER PUBLICATIONS

Preliminary Search Report dated Jul. 14, 2006 with English translation.

(Continued)

*Primary Examiner*—Michael R Mansen
*Assistant Examiner*—Brian M O'Hara
(74) *Attorney, Agent, or Firm*—Dickinson Wright PLLC (57) ABSTRACT

The present invention relates to a sandwich-structure flat active actuator that is symmetrical relative to the mid-plane comprising at least one piezoelectric flat layer having an active direction superpose and fixedly attached to at least one passive flat layer of fabric with rigid warp and weft oriented in two directions forming a mesh; the two directions of each layer of fabric are the same. The active direction of each piezoelectric layer is oriented along one and the same diagonal of the mesh of the layers of fabric. The invention is also aimed at a device consisting of two actuators mounted head-to-tail. The invention applies to the active torsion of structures such as, for example, a helicopter blade.

7 Claims, 6 Drawing Sheets

U.S. PATENT DOCUMENTS

| | | | | |
|---|---|---|---|---|
| 5,934,609 | A * | 8/1999 | Kuklinski | 244/51 |
| 6,048,622 | A * | 4/2000 | Hagood et al. | 428/461 |
| 6,173,924 | B1 | 1/2001 | Young et al. | |
| 6,629,341 | B2 * | 10/2003 | Wilkie et al. | 29/25.35 |
| 7,053,528 | B2 * | 5/2006 | Horoschenkoff et al. | 310/333 |
| 7,081,701 | B2 * | 7/2006 | Yoon et al. | 310/369 |
| 7,449,818 | B2 * | 11/2008 | Kato et al. | 310/331 |
| 2005/0258713 | A1 * | 11/2005 | Lubitz et al. | 310/328 |

FOREIGN PATENT DOCUMENTS

| | | | |
|---|---|---|---|
| EP | 822602 | A1 * | 2/1998 |
| FR | 2833571 | | 6/2003 |
| GB | 2348537 | | 10/2000 |
| WO | 0051190 | | 8/2000 |
| WO | 0133648 | | 5/2001 |

OTHER PUBLICATIONS

C. E. S. Cesnik, et al.; "Modeling, Design, And Testing of the NASA/Army/MIT Active Twist Rotor Prototype Blade," XP009069472, Proceedings 55th Annual Forum of the American Helicopter Society, Montreal, Canada, May 25-27, 1999, pp. 533-544.

J. Rodgers, et al.; "Preliminary Mach-scale hover testing of an integral twist-actuated rotor blade," Smart Structures and Integrated Systems, San Diego, CA, USA, Mar. 2-5, 1998, Proceedings of the SPIE, vol. 3329, 1998, pp. 291-308, XP002389450.

* cited by examiner

SANDWICH-STRUCTURE FLAT ACTUATOR AND APPLICATION TO STRUCTURAL TORSION

FIELD OF THE INVENTION

The present invention relates to an active actuator capable of providing a transverse shearing displacement in a plane, a device using two actuators of this type and its application to structural torsion.

It relates more particularly to a sandwich-structure flat active actuator comprising at least one piezoelectric flat layer having an active direction superposed and fixedly attached to at least one flat passive layer of fabric with rigid warp and weft forming a mesh. The active direction of the piezoelectric layer is oriented in a particular manner relative to the mesh of the layers of fabric.

The invention applies to the active torsion of structures such as, for example, a helicopter blade.

BACKGROUND OF THE RELATED ART

In aviation, the concern to enhance maneuverability, safety or to reduce noise nuisance is leading aircraft designers ever more frequently to use active airfoil elements. These elements are capable of deforming in a controlled manner in response to a precise set point in order to modify the behavior of the aircraft in their environment.

Thus, the controlled torsion of aircraft airfoils has been the subject of many studies and has given rise to the production of actuators allowing a relative displacement of the top surface or suction surface relative to the bottom surface or pressure surface.

In addition to the mechanical and hydraulic actuators as presented by De Laurier et al. (U.S. Pat. No. 5,288,039) or Young et al. (U.S. Pat. No. 6,173,924), it is also possible to cite the piezoelectric actuators that are of more particular relevance to the invention as described by Jeffs et al. (GB 2 348 537) or by Matthew L. Wilbur et al. ("Hover testing of the NASA/ARMY/MIT active twist rotor prototype blade"; the American Helicopter Society 56th Annual Forum, Virginia Beach, Va., May 2-4, 2000) or else in the French patent in the name of the applicant (FR 2.833.571).

In the English patent GB-2 348 537, the trailing edges of the suction surface and of the pressure surface are fixedly attached together by means of a tube split parallel at the trailing edge along the span of the airfoil. The two lips of the slot are arranged to receive the piezoelectric actuators that are capable of causing one lip to slide relative to the other along the span. Because of the low value of the available elongation, the relative displacement of the trailing edges is too small to allow an effective controlled torsion of the airfoil.

In the work of Matthew L. Wilbur, a helicopter blade is fitted, at six locations distributed along its span all situated in the virtually flat zone of maximum thickness, with two piezoelectric actuators, one in the suction surface, the other in the pressure surface. Each actuator comprises two piezoelectric layers of the MFC (Macro Fiber Composite) type, each capable of elongating or contracting in an active direction. A first central layer of glass fabric is sandwiched between two piezoelectric layers. The active directions of the piezoelectric layers are oriented respectively along the warp and the weft of the glass fabric. This first sandwich is itself sandwiched between two other layers of glass fabric whose warp and weft are oriented along the diagonals of the warp and weft of the fabric of the central layer, hence of the active directions. It is this five-layer sandwich that forms an actuator.

When a virtually flat actuator is activated, it torsionally deforms spontaneously, directly inducing the torsion of the blade. Placing assemblies on the pressure surface and on the suction surface amplifies the torsion of the blade. In addition to the difficulty of installing such assemblies in the structure of the blade, they are situated in a closed section, called "D-spar", having a high torsional rigidity which has a strong resistance to the deformations of the actuators, thus creating powerful stresses between the layers that form them. In addition, these actuators being situated on the pressure and suction surface skins, at the maximum thickness of the profile, they therefore also sustain powerful stresses when the blade is acted upon in bending flap motion.

In order to limit this resistance, in the French patent in the name of the applicant (FR 2.833.571), the pressure surface and suction surface trailing edges are, according to a variant embodiment, directly connected to piezoelectric actuators operating in a shearing motion and continuously closing the section along the span in order to obtain a high torsional rigidity. But, to preserve this rigidity, the actuators are necessarily installed close to the trailing edge where the thickness of the airfoil is reduced, which limits the dimension of the actuator according to the thickness of the profile. Because of the low value of the angle of shear, the relative displacement thus available of the trailing edges is too slight to allow an effective controlled torsion of the airfoil.

SUMMARY OF THE INVENTION

It was therefore desirable for the applicant to be able to use a device which continuously closes the section of the blade, provides a high torsional rigidity, has limited internal stresses when the blade is subjected to external loads and allows a considerable travel between the two trailing edges of the suction surface and pressure surface along the span.

The subject of the present invention is a flat actuator capable of deforming in a shearing motion and a device using two actuators according to the invention mounted head-to-tail capable of deforming in a shearing motion each in their plane. It also relates to the particular installation of such a device in a helicopter blade structure of which it continuously closes the initially open section.

The actuator, the constituent element of the device of the invention, is of the flat, sandwich-structure type comprising two attachment zones designed to transmit the relative shearing displacement generated by the actuator, and at least three flat superposed layers comprising at least one layer of a fabric whose warp and weft consist of rigid fibers disposed in two directions of the plane, forming a mesh of juxtaposed parallelograms, and at least one piezoelectric active flat layer capable of lengthening or retracting in an active direction, each face of a layer being bonded over its whole surface to a face of the adjacent layer. In the actuator of the invention, the sandwich structure is symmetrical relative to the mid-plane of the actuator, promoting a flat shearing deformation, the active direction of each piezoelectric flat layer is oriented along one and the same diagonal of the mesh of each layer of fabric whose warp and weft are oriented in two directions of the plane, the attachment zones of the actuator, of elongated shape in a first of the two directions of the plane, are disposed along the opposite ends of the actuator in the second direction of the plane, thanks to which each flat layer of fabric being acted upon in a single diagonal of the mesh, the parallelograms deform causing the attachment zones to displace in the plane parallel with one another in the first direction of the plane.

According to a first embodiment, the actuator comprises two layers of fabric sandwiching an active flat layer.

According to a second embodiment, the actuator comprises a layer of fabric sandwiched between two active flat layers which elongate and retract together.

The invention also relates to a device comprising the stacking of two actuators mounted head-to-tail, two facing attachment zones of the actuators being fixedly attached and the two active directions not being parallel, the other two actuator attachment zones, left free, displace in parallel in the inverse direction in the first direction of the plane with an amplitude equal to the sum of the amplitudes of the displacements of the two actuators.

The invention also relates to the installation of the device in a helicopter blade structure, a free attachment zone being fixedly attached to the suction surface, the other free attachment zone being fixedly attached to the pressure surface.

According to a first embodiment of installation, the device is situated between the suction surface and the pressure surface, inside the blade, in the plane of the chord. Two attachment zones are directly fixedly attached to one another, the other two attachment zones are fixedly attached respectively to the pressure surface and to the suction surface, immediately next to the trailing edge. The height of the device is then minimal, which makes it easier to incorporate, without, for all that, limiting the travel thereof.

According to a second embodiment of installation, the device is placed in the extension respectively of the pressure surface and of the suction surface. It forms the trailing edge of the blade, of which it continuously closes the initially open section. It then consists of two flat actuators whose two attachment zones are fixedly attached to one another, the respective planes of the actuators forming between them the angle of the trailing edge desired for the blade; the other two attachment zones are fixedly attached respectively to the free ends of the pressure surface and of the suction surface.

BRIEF DESCRIPTION OF THE DRAWINGS

The figures of the appended drawing will clearly explain how the invention can be embodied. In these figures, identical reference numbers indicate similar elements.

DETAILED DESCRIPTION OF THE INVENTION

Example 1

Figure 1:
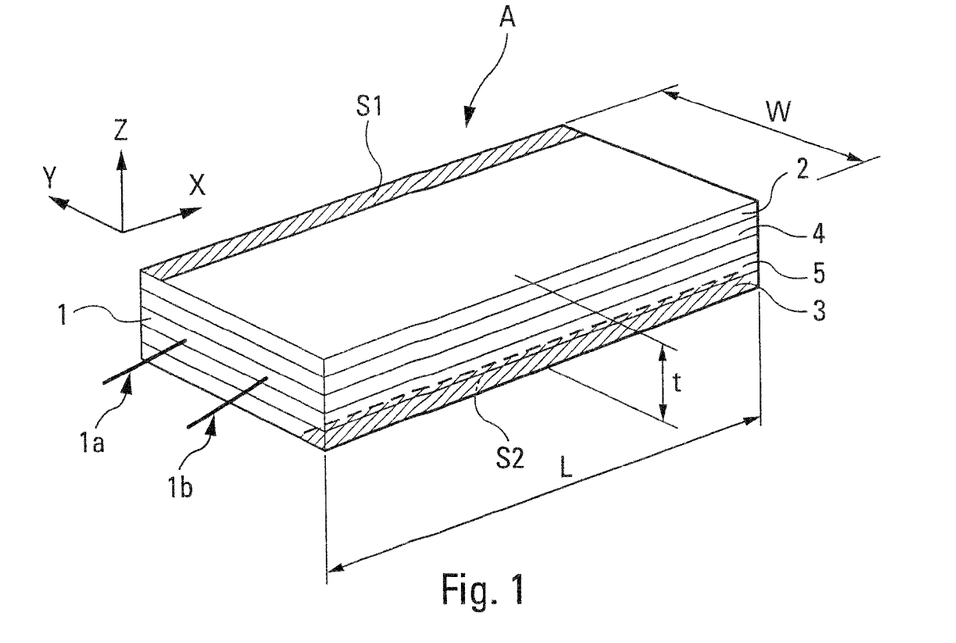
FIG. 1 is a schematic view of an actuator according to the invention, at rest.

The sandwich-structure flat actuator A, according to the present invention and shown in FIG. 1, has a thickness t in the direction Z, a length L in the direction X and a width W in the direction Y. This actuator consists of the following elements:

In the central plane there is a piezoelectric active flat layer 1 capable of elongating or retracting along the line bisecting the directions X and Y when it is electrically supplied. This piezoelectric layer consists of piezoelectric unidirectional rectangular fibers oriented along the line bisecting the directions X and Y and electrically supplied by electrodes 1a and 1b. The fibers are sandwiched between structural epoxy layers and polyamide films incorporating the interdigital electrodes perpendicular to the fibers. The assembly has a thickness of approximately 0.3 mm and an active rectangular surface area of 85×57 mm$^2$ for example. The disadvantage of this type of layer is that it is very thin and therefore sensitive to buckling. Another disadvantage relates to its elongation in the direction X which may pose problems in the bonding zones of the zones of attachment with their supports, in particular if the latter are very rigid. The shearing stress may then cause the bonded joint to break.

A first 0.2 mm fabric 2, for example of taffeta type wave, whose fibers are made of high modulus material such as for example HM carbon, is placed on the top of the whole surface of said active flat layer. This fabric has a weft and a warp oriented respectively in the direction X and the direction Y. The weft and the warp define a mesh of juxtaposed parallelograms.

A second fabric 3 identical to the first fabric 2 and oriented in the same manner is placed on the bottom of the whole surface of said flat active layer.

Two bonding joints 4 and 5 are placed between the three layers to bind them together. These bonding joints have a thickness set at 0.1 mm by means of a flexible textile grille and an appropriate Young's modulus so as to best transmit the shearing displacement of said piezoelectric active flat layer 1 to said fabrics 2 and 3.

An attachment zone S1 is oriented on the weft of the fabrics and extends along one end on the warp of these same fabrics. It is situated for example on an outer face of the actuator.

The other attachment zone S2 is oriented on the weft of the fabrics and extends along the other end on the warp of these same fabrics. It is situated for example on the other outer face of the actuator.

Figure 2:
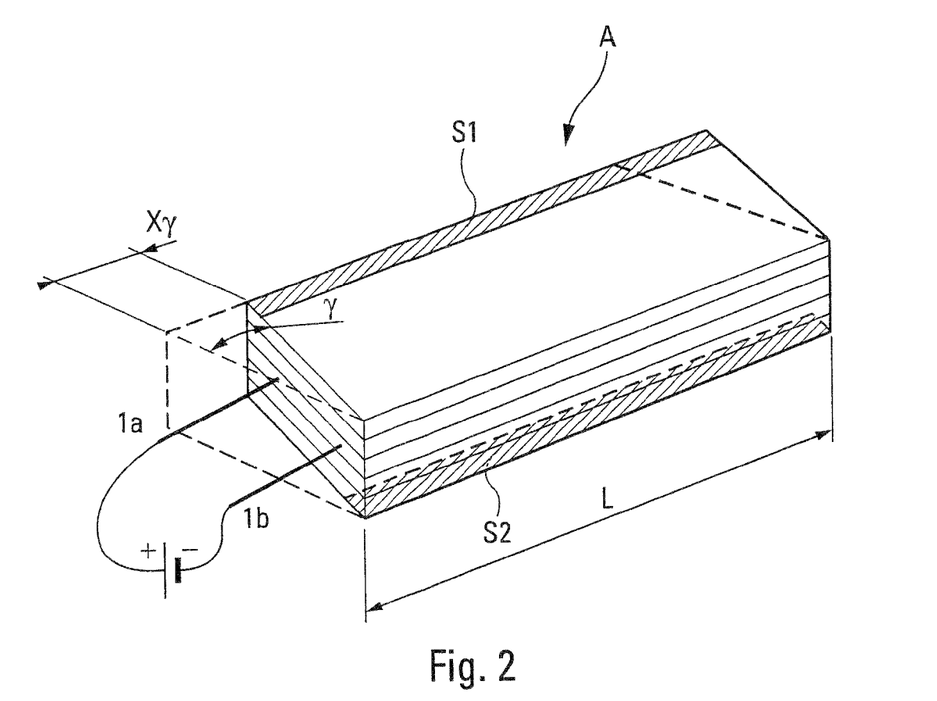
FIG. 2 illustrates the shearing deformation of the actuator of FIG. 1, when it is activated.

The principle of operation of the actuator is that, when the active flat layer 1 is electrically supplied by the electrodes 1a and 1b, it generates, along the line bisecting the directions X and Y, in the plane X-Y, an extension which is transmitted, thanks to the bonding joints, to the two composite fabrics 2 and 3. The parallelograms of the mesh of fabrics, acted upon on the same diagonal, deform. This deformation transforms into a shear angle γ relative to the direction γ as illustrated in FIG. 2 and the active flat layer 1 supplies a shearing displacement $X_\gamma = \gamma \times W$ along the axis X as indicated in said FIG. 2.

The actuator elongates slightly in the direction X because the weft of the fabric resists it. The bonding joints are not therefore very stressed. Similarly, the actuator does not elongate very much in the direction Y because the warp of the fabric resists it. The actuator does not deform very much in the direction Z because it is symmetrical and the resultant of the applied forces is in the plane X-Y.

Such an actuator has been manufactured with, as the active flat layer, an MFC of active section 85×57×0.3 mm$^3$ sandwiched between two SXM10 carbon fabrics and has been tested in operation at +/−750 Volts.

By means of a rosette of three gauges bonded to the center of the active flat layer, the following were measured:
the deformations in the direction X;
the deformations in the direction Y;
the shearing deformations γ.

Also measured by means of an optical sensor were the displacements of the four corners of the actuator which, fitted to its width W, make it possible to deduce the shearing deformations. The results are given in table 1 in which 1 μdef=10$^{-6}$ meter by meter.

TABLE 1

|  | MFC only | Actuator |
|---|---|---|
| (μdef) | 61 | 30 (−51%) |
| (μdef) | 49 | 27 (−45%) |
| γ rosette measurement (μdef) | 438 | 289 (−34%) |
| γ optical measurement (μdef) | 462 | 255 (−45%) |

Example 2

Figure 10:
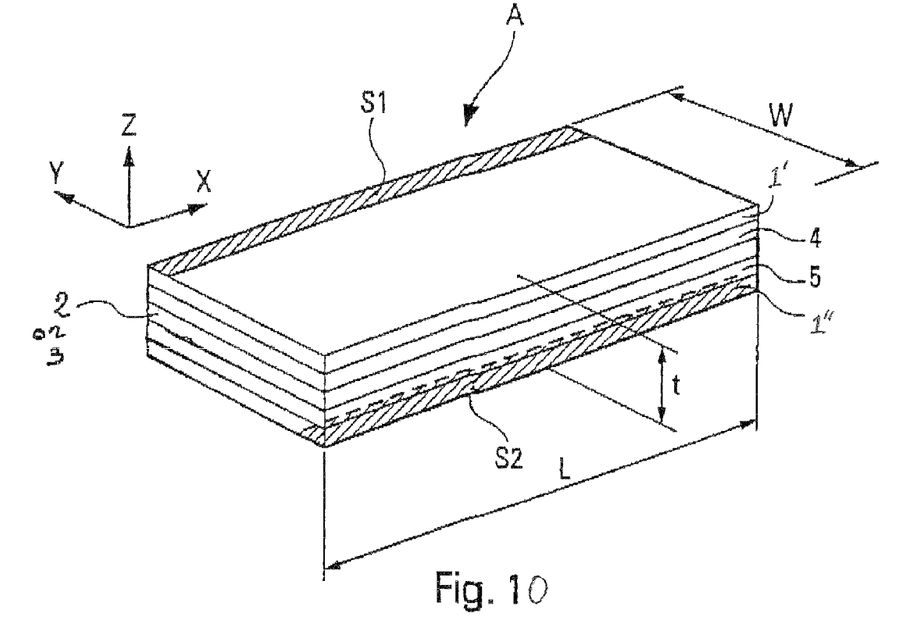
FIG. 10 is a schematic view of an actuator according to another embodiment of the invention.

Still in the context of a three-layer actuator, a variant embodiment, illustrated in FIG. 10, makes it possible to increase the shearing displacement.

This actuator consists of the following elements:

A 0.2 mm fabric 2, for example of taffeta type, whose fibers are made of high modulus material, such as HM carbon, is placed in the center. This layer of fabric 2 is flat and has a weft and a warp oriented respectively in the direction X and the direction Y. The weft and the warp define a mesh of juxtaposed parallelograms.

A first piezoelectric active flat layer r capable of elongating or retracting along the line bisecting the directions X and Y when it is electrically supplied is placed on the top of the whole surface of said layer of fabric 2. This piezoelectric layer 1' is of the same type as that of the preceding example. It therefore generates a shear angle γ relative to the direction X.

A second piezoelectric active flat layer 1" identical to the first and oriented in the same manner is placed on the top of the whole surface of said layer of fabric 2.

Two bonding joints 4, 5 are plated between the three layers to bind them together. These bonding joints 4, 5 have a thickness set at 0.1 mm by means of a flexible textile grille and an appropriate Young's modulus so as to best transmit the shearing displacement of said actuators to said composite fabric.

The first attachment zone is situated on an outer face of the actuator. It is oriented on the weft of the fabric and extends along one end on the warp of this same fabric.

The second attachment zone is situated on the other outer face of the actuator. It is oriented on the weft of the fabric and extends along the other end on the warp of this same fabric.

In operation, the two piezoelectric flat active layers of this actuator are simultaneously electrically supplied at one and the same voltage. They generate along one and the same line bisecting the directions X and Y, in the plane X-Y, an extension which is transmitted, thanks to the bonding joints, to the layer of fabric. The parallelograms of the fabric mesh, acted upon on the same diagonal, deform. This deformation transforms into a shear γ as in the preceding example. Here again, the bonding joints are not acted upon very much and the resultant of the forces applied is in the plane X-Y.

Such an actuator has been manufactured with an SXM10 carbon fabric sandwiched between two MFCs of active section 85×57×0.3 mm$^3$ serving as piezoelectric active flat layers and has been tested in operation with the same measurement means and in the same conditions as in example 1.

The results are shown in table 2, in which 1 μdef=10$^{-6}$ meter by meter.

TABLE 2

|  | MFC only | Actuator |
|---|---|---|
| X (μdef) | 61 | 53 (−13%) |
| Y (μdef) | 49 | 42 (−14%) |
| γ rosette measurement (μdef) | 438 | 397 (−9%) |
| γ optical measurement (μdef) | 462 | 383 (−17%) |

Figure 3:
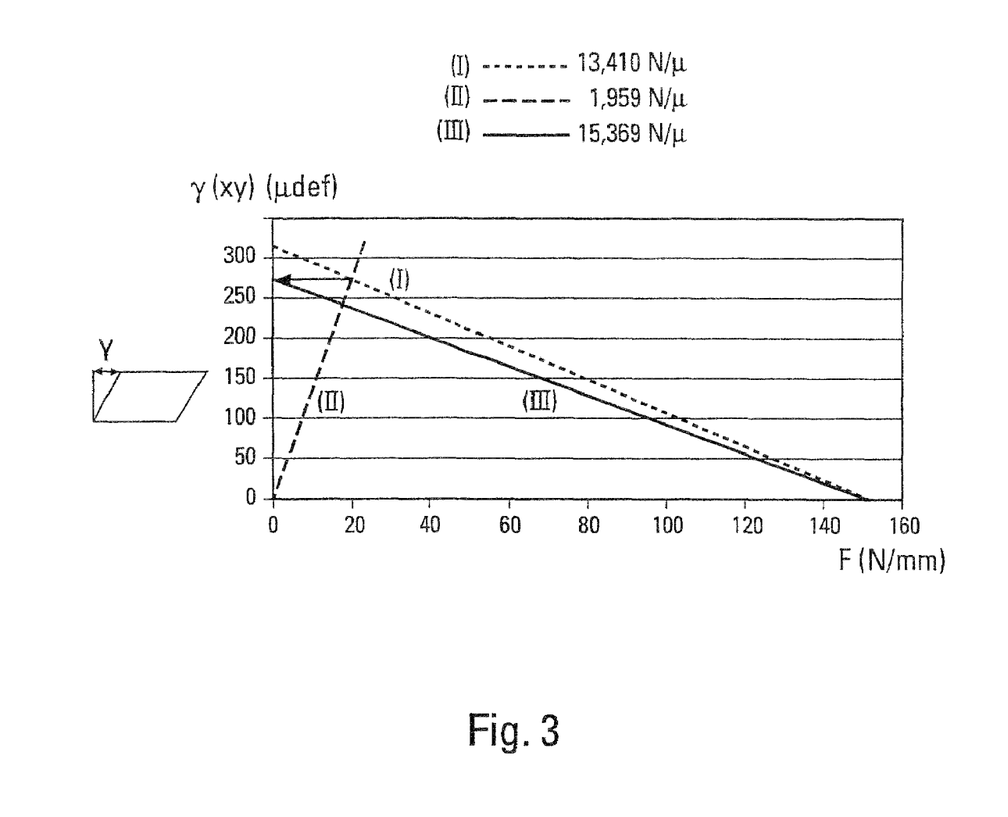
FIG. 3 shows the shearing diagrams characteristic of an actuator of the invention.

FIG. 3 illustrates an evaluation of the performance of such an actuator.

For the bare MFCs, the curve (I) is the straight line of the shear angle γ peak-to-peak measured on an MFC supplied with +/−500 V according to the shearing force F established from the computed shearing stiffness slope. If γ=0, the shearing force is called blocking because it is such that it causes the loss of the whole free travel that is γmax (320 μdef) when F=0.

For the carbon fabric and the two bonding joints, the curve (II) is a straight line expressing the shearing stiffness of the assembly.

The curve (III) characterizes the actuator that is the assembly of the layer of fabric+bond with the two MFCs.

To supplement these two examples, it is possible to use a greater number of flat layers. However, in order to comply with the invention, the structure of the various variants embodied must simultaneously satisfy several essential features.

First of all, the structure must be symmetrical relative to the mid-plane, this in order to promote a flat shearing deformation of the actuator.

Then, the weft and the warp of each flat layer of fabric which define a parallelogram-shaped mesh, must all be oriented in the same two directions respectively of their plane, parallel to the mid-plane.

In addition, all the piezoelectric active flat layers must have, each in their plane, active directions that are parallel and of the same direction oriented on the same diagonal of the parallelogram-shaped mesh.

Finally, the two attachment zones must be situated at the opposite ends of the weft and of the warp of the layers of fabric and be placed respectively in the direction of the warp or of the weft of the layers of fabric.

Example 3

Figure 4:
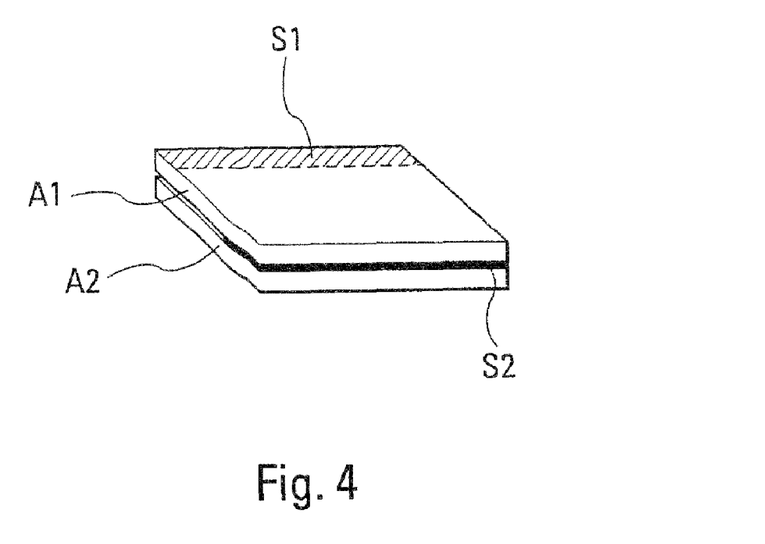
FIG. 4 is a schematic view of a device according to the invention, at rest.

The invention relates to a device consisting of the head-to-tail assembly of two actuators A1 and A2 identical to the actuator A described in the preceding examples. The two actuators A1 and A2 are mounted as indicated in FIG. 4, one above the other, parallel with one another and bonded by their respective attachment zones S2.

The principle of operation of the invention is that, when the first actuator complying with that of example 1 or 2 is activated, it generates, in the plane X-Y, and at 45°, an extension which is transmitted to the fabric whose mesh, acted upon on the first diagonal, deforms in a parallelogram. This deformation transforms into a shear $\gamma$ and the first actuator provides a shearing displacement $X_{\gamma 1}=\gamma \times W$ along the axis X as shown in FIG. 5.

Similarly, when the second actuator is activated, it generates, in the plane X-Y and at 135°, an extension which is transmitted to the fabric whose mesh, acted upon on the second diagonal, deforms in a parallelogram. This deformation transforms into a shear $-\gamma$ and the second actuator A2 provides a shearing displacement $X_{\gamma 2}=-\gamma \times W$ along the axis X. This shearing displacement is opposite to the shearing displacement of the first actuator A1.

Figure 5:
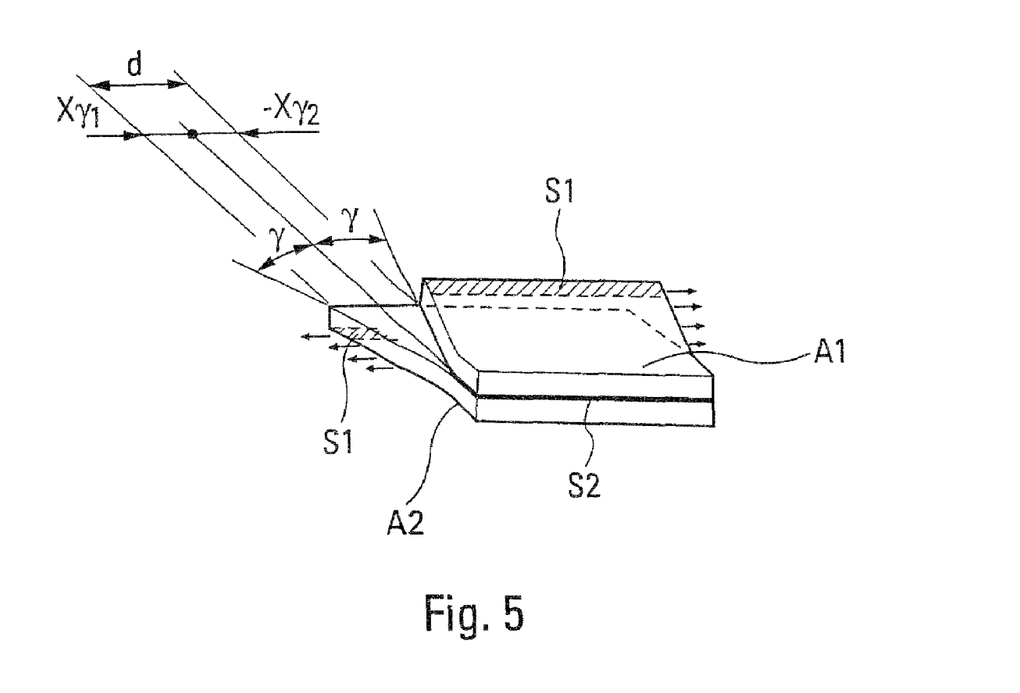
FIG. 5 represents the shearing deformation of the device of FIG. 4, when it is activated.

The amplitude d of the total shearing displacement of the device between the respective attachment zones S1 is equal to the sum of the amplitudes of the shearing displacements of each actuator, that is $d=X_{\gamma 1}-X_{\gamma 2}$ and, as in the example the actuators are identical, $d=2\gamma \times W$ as indicated in FIG. 5.

Example 4

A device according to the invention may use a combination of two actuators that are not strictly identical. For example, it is possible to combine a first actuator according to example 1 with a second actuator having the same sandwich structure but, on the one hand, whose width W in the direction Y is greater than that of the first actuator and, on the other hand, whose two attachment zones are situated on the same face of this second actuator.

The device obtained then has two adjacent attachment zones that can be accessed via a single face, which may have a practical advantage for certain applications.

A device according to the invention may advantageously be used in combination with a helicopter blade structure in order to make it sustain a torsion along the span. In these conditions, the system is no longer strictly flat during its operation but is slightly twisted. However, this deformation is locally slight and does not fundamentally change the operation of the device described in the preceding examples.

Example 5

Figure 6:
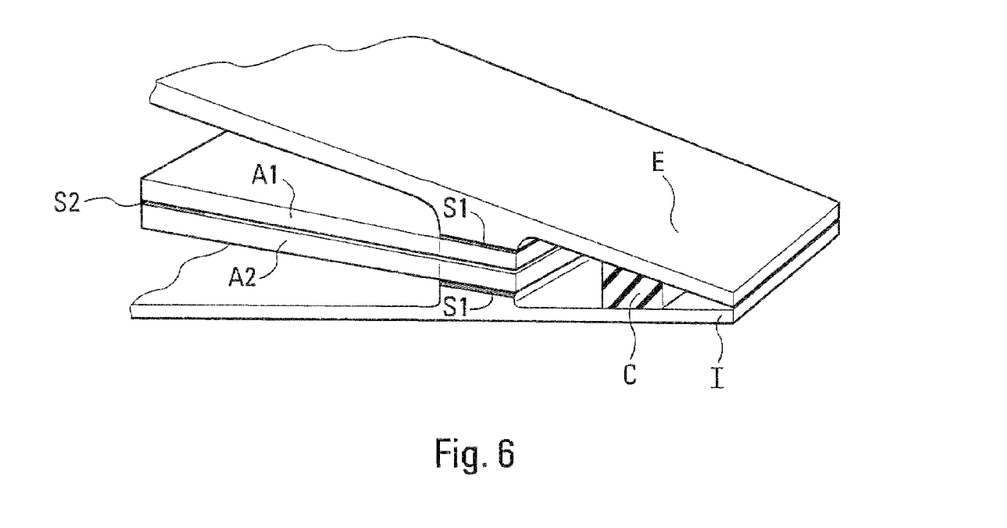
FIG. 6 is a view in perspective at rest of a helicopter blade section in which the device according to a first embodiment is installed.

As shown in FIG. 6, the device of the invention may be placed inside the profile of an open aircraft airfoil, and close to its trailing edges. An airfoil is called open when the pressure surface and the suction surface are not fixedly attached together close to the trailing edge of the surface. The suction surface E and pressure surface I trailing edges are furnished with reinforcements facing the attachment zones S1 of A1 and of A2 of the device. The trailing edges are bonded, or screwed, at the reinforcements to the attachment zones S1 of each of the identical actuators A1 and A2. The bondings or screwings are distributed along the span, parallel to the axis X of FIG. 5. The zones S2 of A1 and of A2 and the trailing edge are situated, along the chord, on either side of the attachment zones S1 of A1 and of A2 of the device to the airfoil. The plane of symmetry of the device at rest is situated in the vicinity of the chord plane of the profile, hence of the neutral bending axis. The device is therefore subjected to only very slight stresses when the blade is subjected to bending.

The device continuously closes the section of the airfoil zone along the span. However, an additional connection may be made between the pressure surface and suction surface trailing edges by means of a weak modulus elastomer C bonded to a reinforcement of each of the trailing edges, and even directly between the attachment zones S1 of A1 and of A2 of the device, because it is the shearing rigidity of the device that conditions the torsional rigidity of the airfoil zone.

Figure 7:
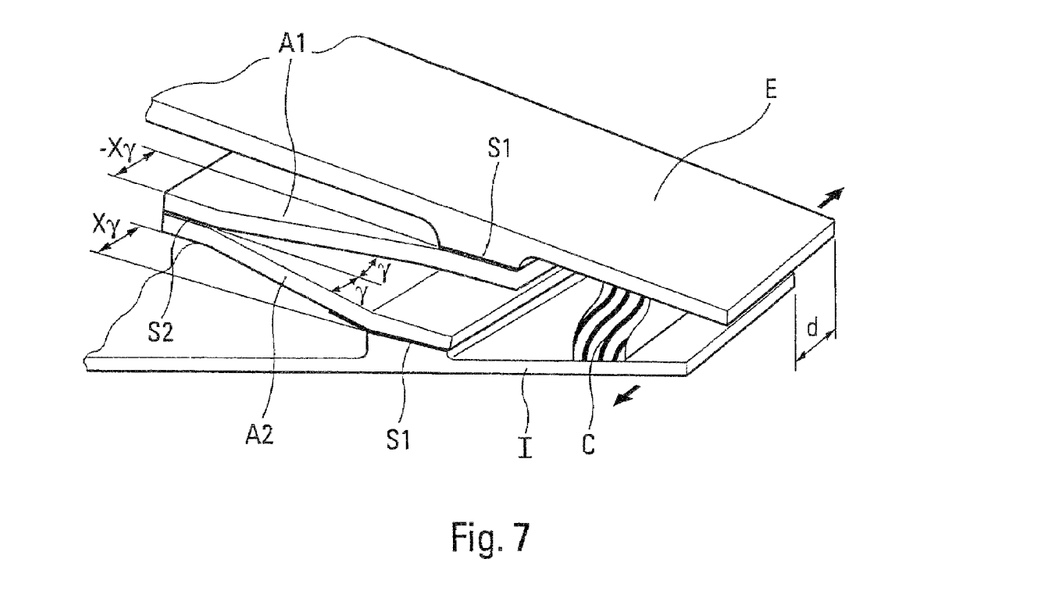
FIG. 7 illustrates the operation of the device according to this first embodiment.

The principle of the device thus installed is identical to that of example 2. The amplitude d of the total shearing displacement of the device between the trailing edges is equal to the sum of the amplitudes of the shearing displacements of each actuator, as indicated in FIG. 7.

Figure 8:
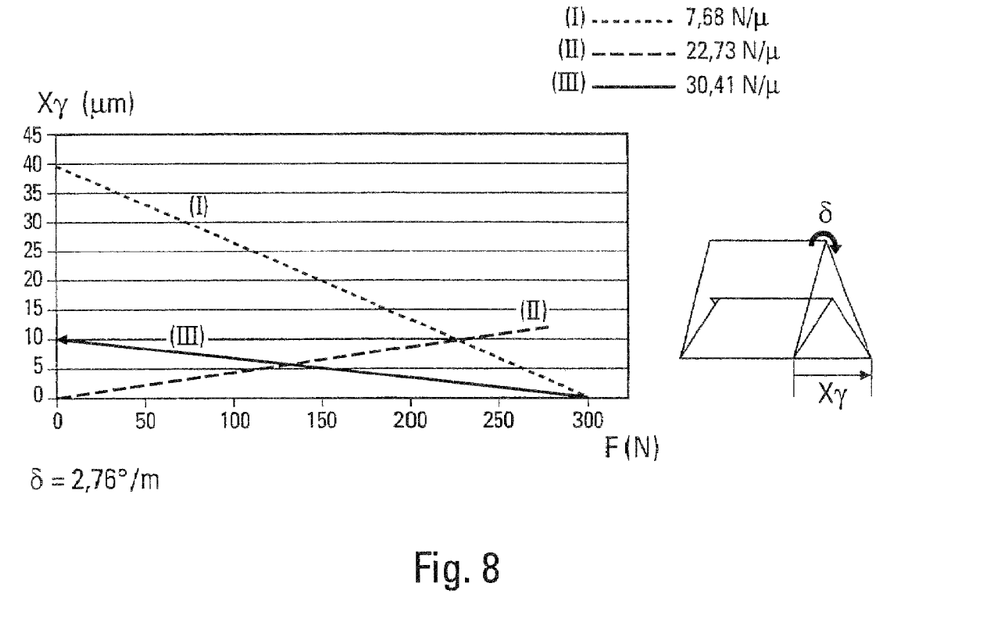
FIG. 8 shows the shearing diagrams characteristic of the device installed in the blade.

FIG. 8 illustrates an evaluation of the performance of such a device.

The curve (I) characterizes the device consisting only of the two simple actuators in series defined previously. The displacements are expressed in µm. The device is supplied at +1500/−500 Volts;

The curve (II) characterizes the shearing stiffness of a blade section (141.5 mm chord) open at the trailing edge. The inner structure is of the conventional type. The shearing force is that which has to be applied to the trailing edges to move them relative to one another;

The curve (III) characterizes the assembled blade and device assembly.

Example 6

Figure 9:
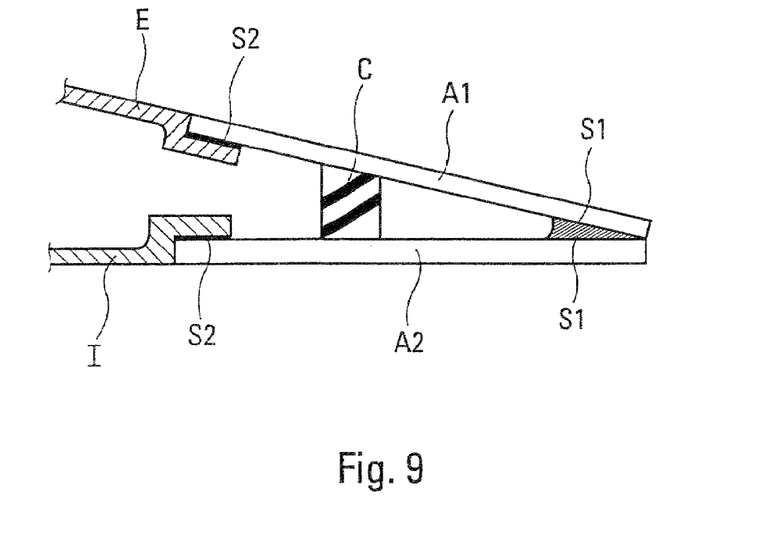
FIG. 9 is a section of the device in a helicopter blade according to a second embodiment.

As shown in FIG. 9, the device of the invention may incorporate the trailing edge itself, the two actuators forming respectively the portions of the suction surface and of the pressure surface immediately adjacent to the trailing edge. The planes of symmetry of the two actuators are no longer parallel. The actuators A1 and A2 of the device are assembled by their respective attachment zones S1 in order to form the desired angle between them for the trailing edge of the blade. The actuator A1 is bonded by its attachment zone S2 on the suction surface on the trailing edge side to the suction surface skin E of the aerodynamic profile and the simple actuator A2 is bonded by its attachment zone S2 on the pressure surface on the trailing edge side on the pressure surface skin I of the aerodynamic profile. The zones S1 and the trailing edge are situated, along the chord, on the same side of the attachment zones S2 of A1 and of A2 of the device on the airfoil.

In addition, a connection between the pressure surface and suction surface trailing edges may be produced by means of a weak modulus elastomer C bonded for example on the inner faces of the double actuator.

The device continuously closes the section of the airfoil along the span and produces a "composite" assembly so as to stiffen the actuator to prevent its buckling.

The invention claimed is:

1. A flat, sandwich-structure actuator having a length in a direction X, a width in a direction Y and a thickness in a direction Z, said actuator comprising:
   at least three flat layers superposed in a sandwich-structure symmetrical relative to the mid plane of the actuator promoting a flat shearing deformation of said sandwich-structure, comprising:
      at least one layer of a fabric whose warp and weft comprise rigid fibers respectively disposed parallel to said directions X and Y, forming a mesh of juxtaposed parallelograms, each layer of fabric having its warp and weft oriented in the same directions X, and Y, and
      at least one piezoelectric active flat layer capable of lengthening or retracting in an active direction, the active direction of each piezoelectric flat layer being oriented along one and the same diagonal of said parallelograms of said mesh, the faces of said piezoelectric active flat layer in contact with a layer of fabric being fixedly attached to said layer of fabric on whole the surface of said piezoelectric active flat layer, and first and second attachment zones designed for transmission of said flat shearing deformation of said sandwich-structure, said first and second attachment zones being of elongated shape and parallel to one of said directions X and Y and being respectively disposed on the opposite outer faces of said sandwich structure along opposite ends of this latter.

2. The actuator as claimed in claim 1, wherein the active layer is situated between two layers of fabric.

3. The actuator as claimed in claim 1, wherein the sandwich structure comprises one layer of fabric situated between two active layers.

4. A flat actuator device, wherein two actuators are provided as claimed in claim 1, mounted head-to-head, two facing attachment zones of the actuators being fixedly attached and two active directions, respectively corresponding to the two actuators, not being parallel, two other facing actuator attachment zones, left free, have a displacement in a first direction of a plane whose amplitude is equal to a sum of amplitudes of the two actuators.

5. The use of the device as claimed in claim 4 in combination with the structure of an open airfoil, wherein the two facing attachment zones left free are fixedly attached respectively to a pressure surface and a suction surface, the device thus closing this structure in the vicinity of a trailing edge of the airfoil.

6. The use as claimed in claim 5, wherein the two fixedly attached facing attachment zones and the trailing edge are situated, along a chord, on either side of the two facing attachment zones left free.

7. The use as claimed in claim 6, wherein the two fixedly attached facing attachment zones and the trailing edge are situated, along the chord, on a same side of the two facing attachment zones left free, the two fixedly attached facing attachment zones forming the trailing edge of the airfoil.

* * * * *